United States Patent
Levinski et al.

(10) Patent No.: US 11,709,433 B2
(45) Date of Patent: Jul. 25, 2023

(54) DEVICE-LIKE METROLOGY TARGETS

(71) Applicant: KLA-Tencor Corporation, Milpitas, CA (US)

(72) Inventors: Vladimir Levinski, Migdal HaEmek (IL); Amnon Manassen, Haifa (IL); Eran Amit, Haifa (IL); Nuriel Amir, St. Yokne'am (IL); Liran Yerushalmi, Zicron Yaacob (IL); Amit Shaked, Haifa (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 17/689,934

(22) Filed: Mar. 8, 2022

(65) Prior Publication Data
US 2022/0197152 A1 Jun. 23, 2022

Related U.S. Application Data

(60) Division of application No. 16/719,226, filed on Dec. 18, 2019, now abandoned, which is a continuation of application No. 15/442,111, filed on Feb. 24, 2017, now Pat. No. 10,551,749.

(60) Provisional application No. 62/462,877, filed on Feb. 23, 2017, provisional application No. 62/442,226, filed on Jan. 4, 2017.

(51) Int. Cl.
G03F 7/20 (2006.01)
G03F 7/00 (2006.01)

(52) U.S. Cl.
CPC ...... G03F 7/70625 (2013.01); G03F 7/70633 (2013.01); G03F 7/70683 (2013.01)

(58) Field of Classification Search
CPC .......... G03F 7/70625; G03F 7/70633; G03F 7/70683
See application file for complete search history.

(56) References Cited

U.S. PATENT DOCUMENTS

2015/0233818 A1\* 8/2015 Manassen .............. G01N 21/41
716/30

\* cited by examiner

*Primary Examiner* — Hwa Andrew Lee
(74) *Attorney, Agent, or Firm* — Hodgson Russ LLP

(57) ABSTRACT

Metrology targets, production processes and optical systems are provided, which enable metrology of device-like targets. Supplementary structure(s) may be introduced in the target to interact optically with the bottom layer and/or with the top layer of the target and target cells configurations enable deriving measurements of device-characteristic features. For example, supplementary structure(s) may be designed to yield Moiré patterns with one or both layers, and metrology parameters may be derived from these patterns. Device production processes were adapted to enable production of corresponding targets, which may be measured by standard or by provided modified optical systems, configured to enable phase measurements of the Moiré patterns.

20 Claims, 16 Drawing Sheets

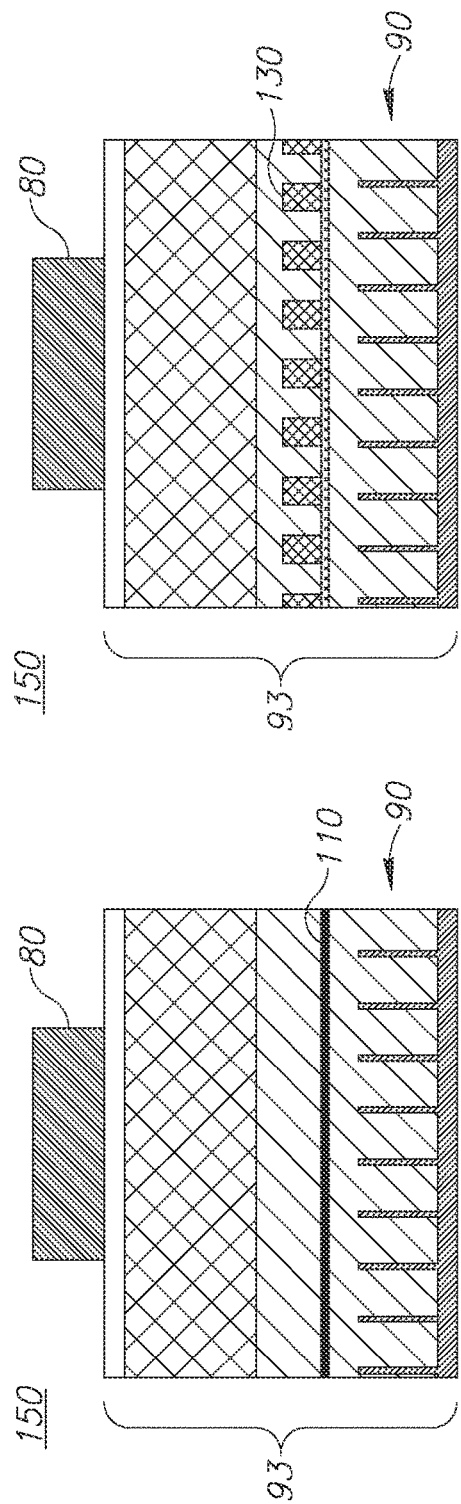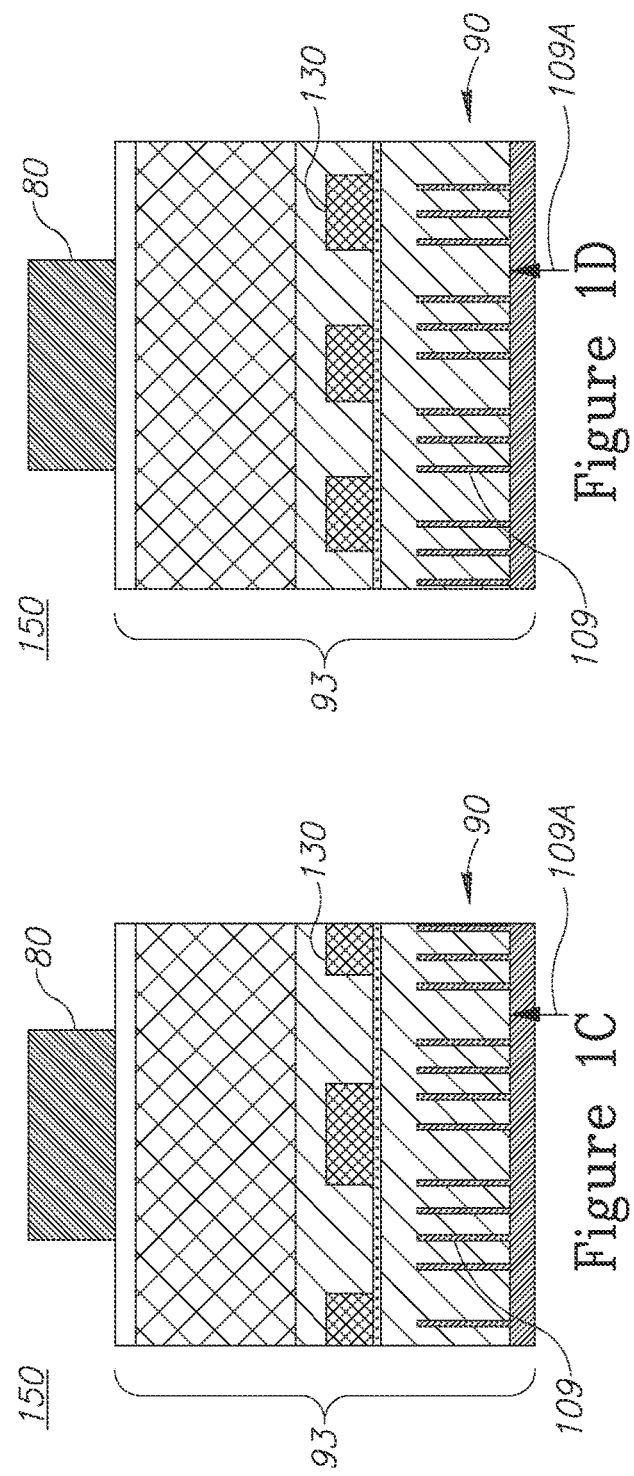

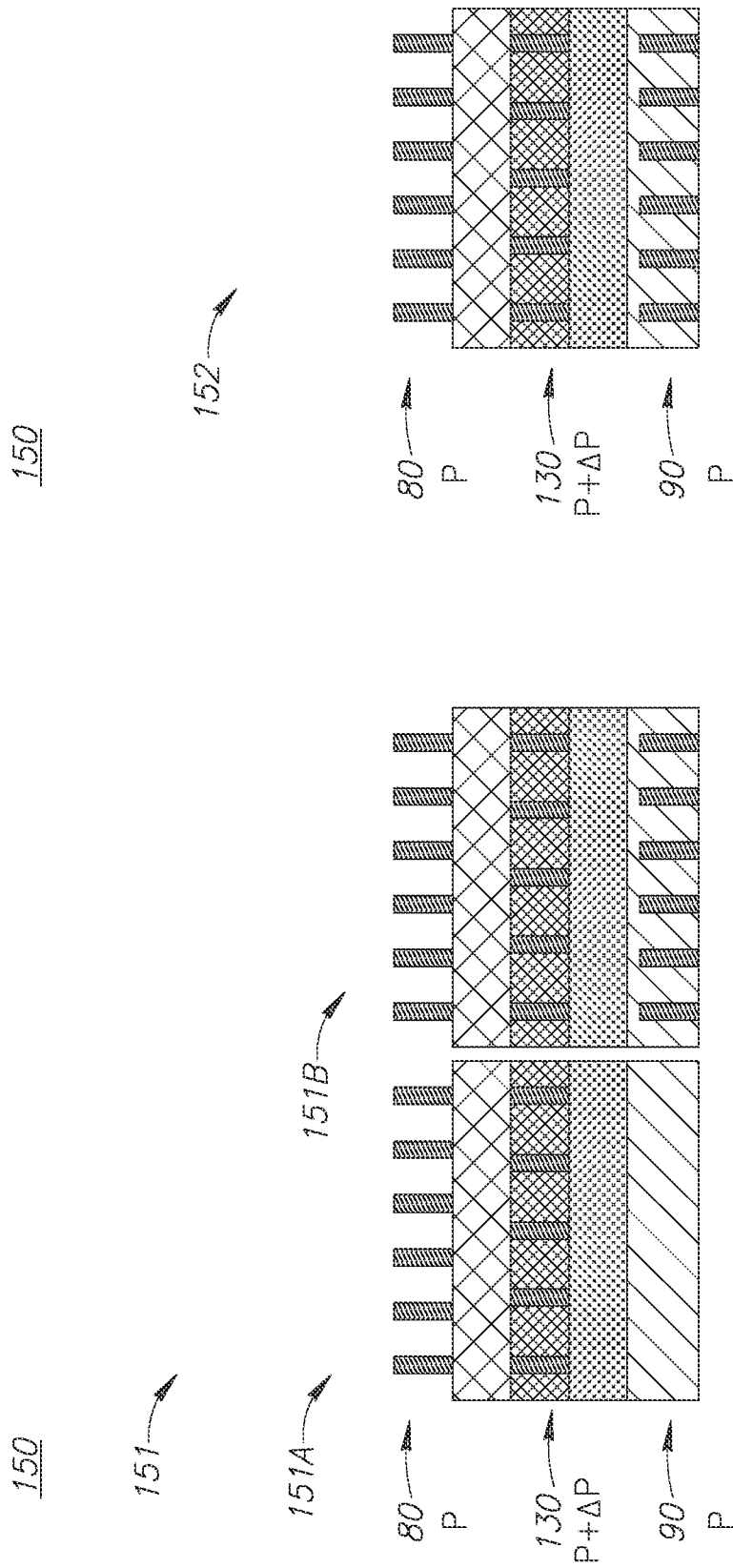

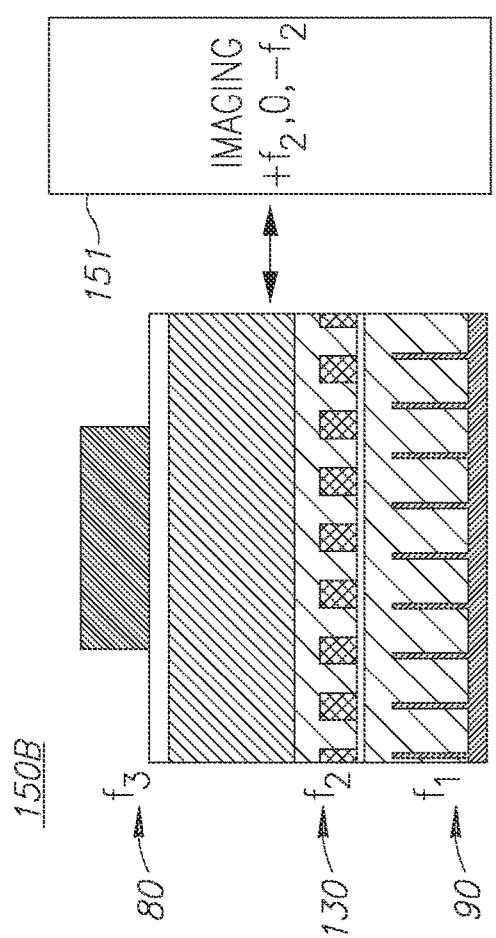
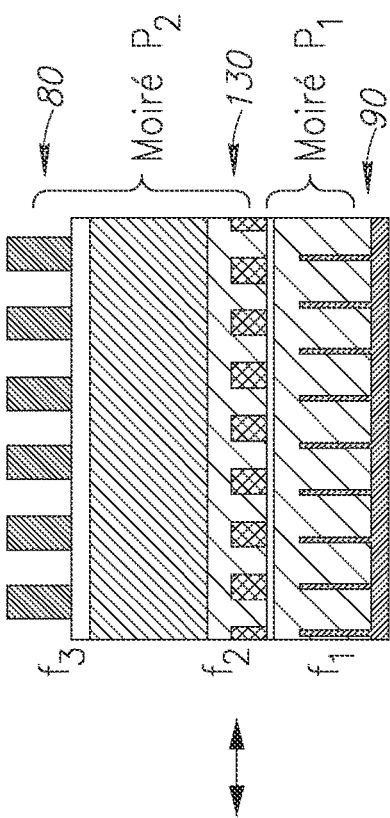
Figure 3B
Figure 3C
Figure 3D
Figure 3E

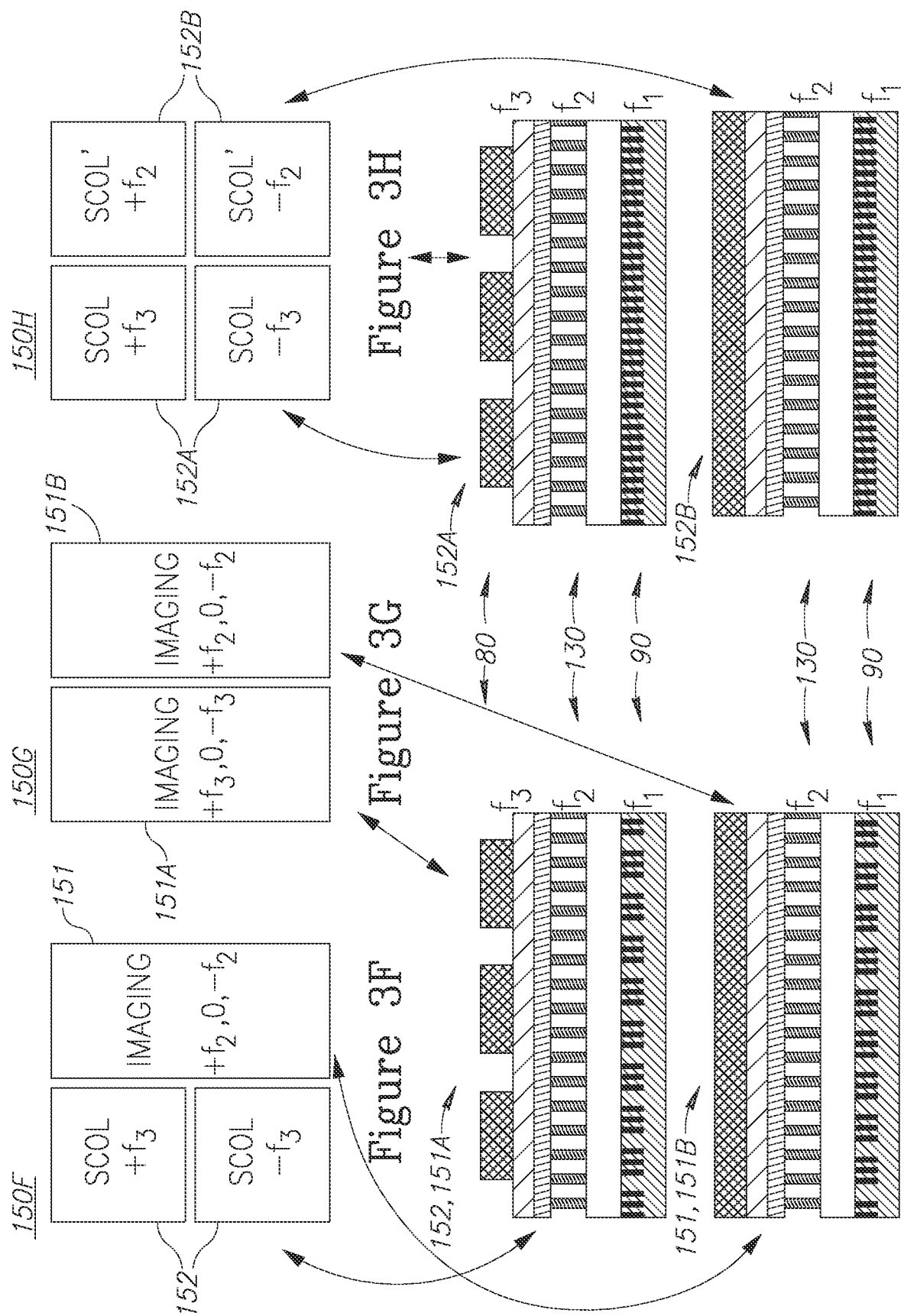

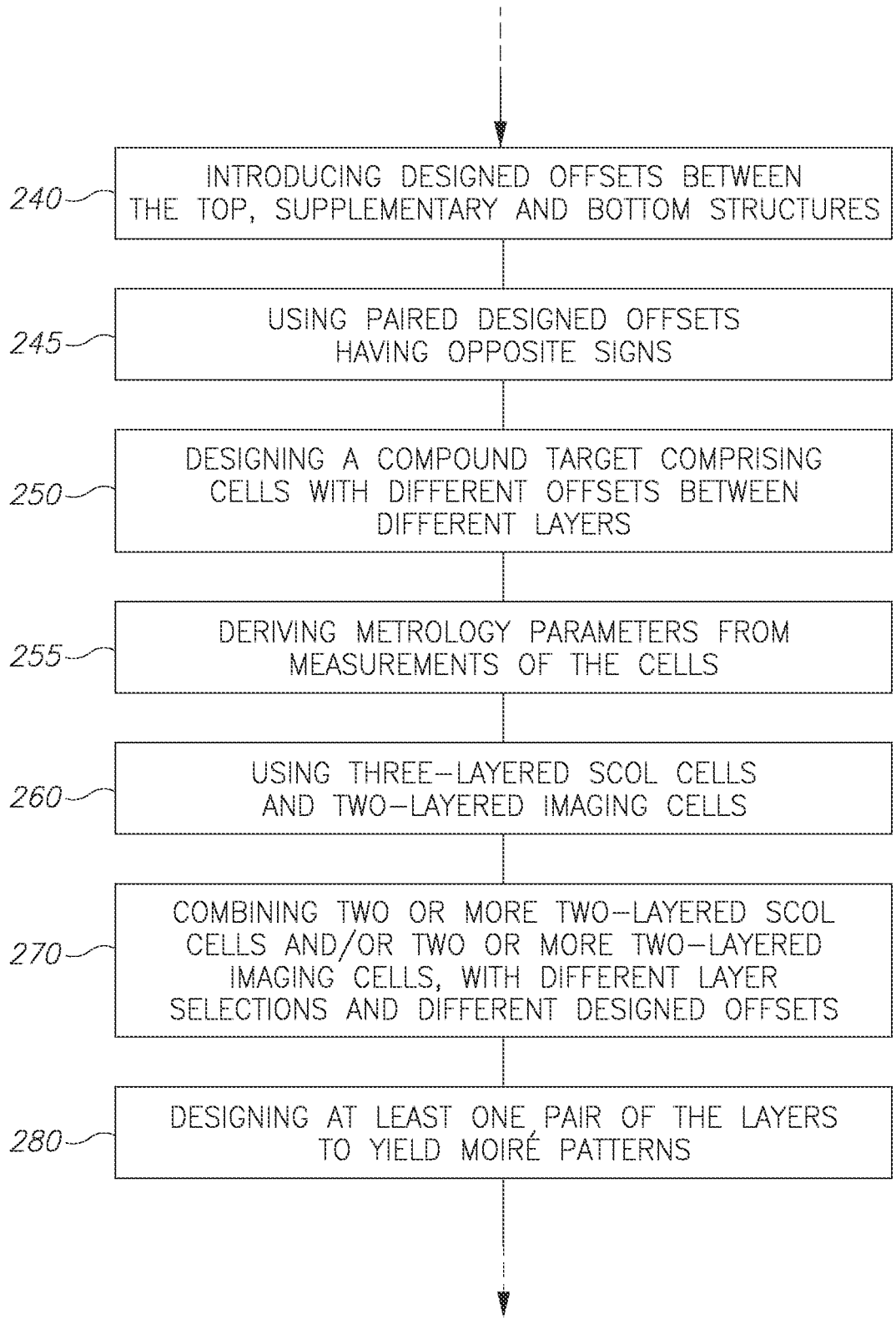
Figure 6 (cont. 1)

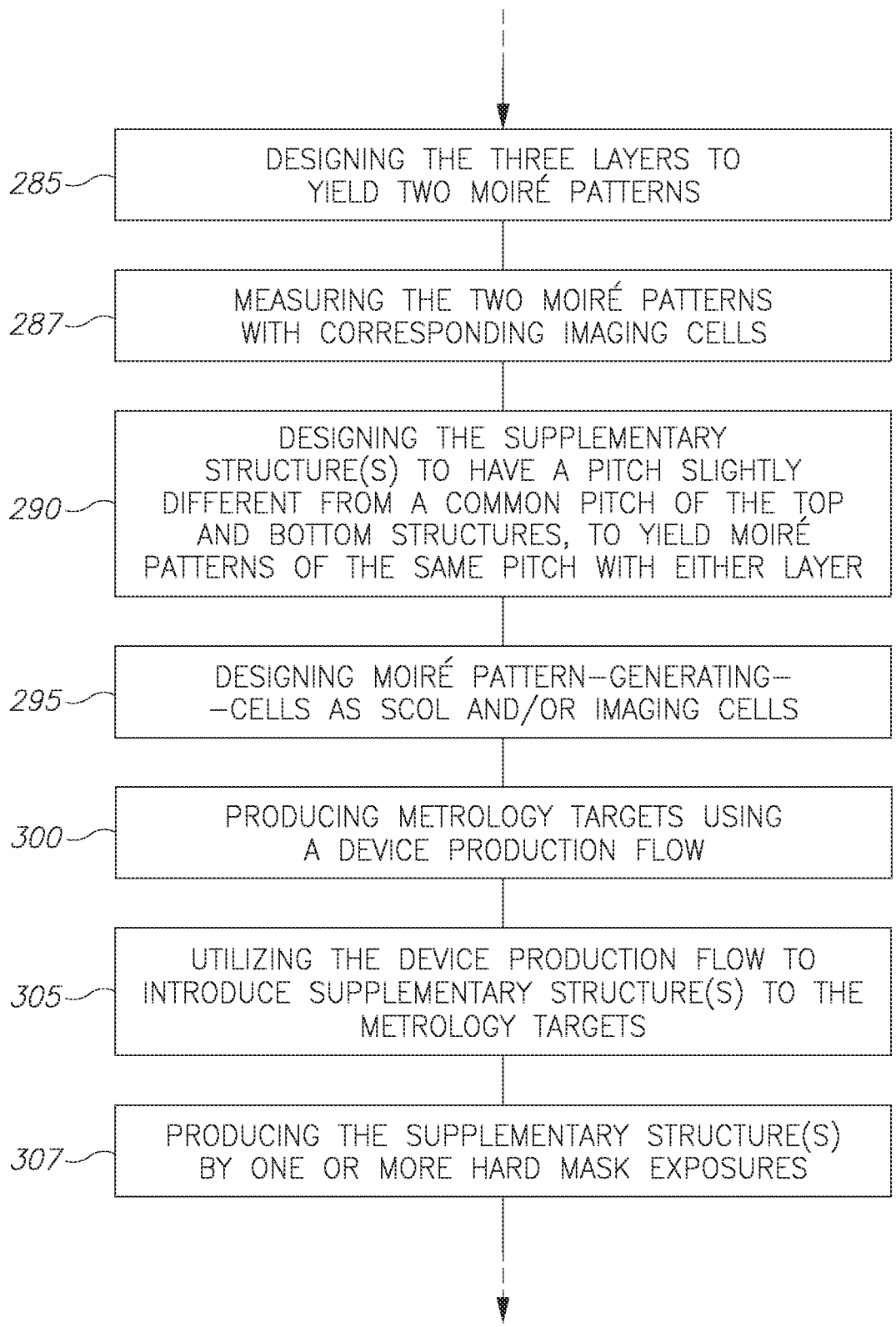
Figure 6 (cont. 2)

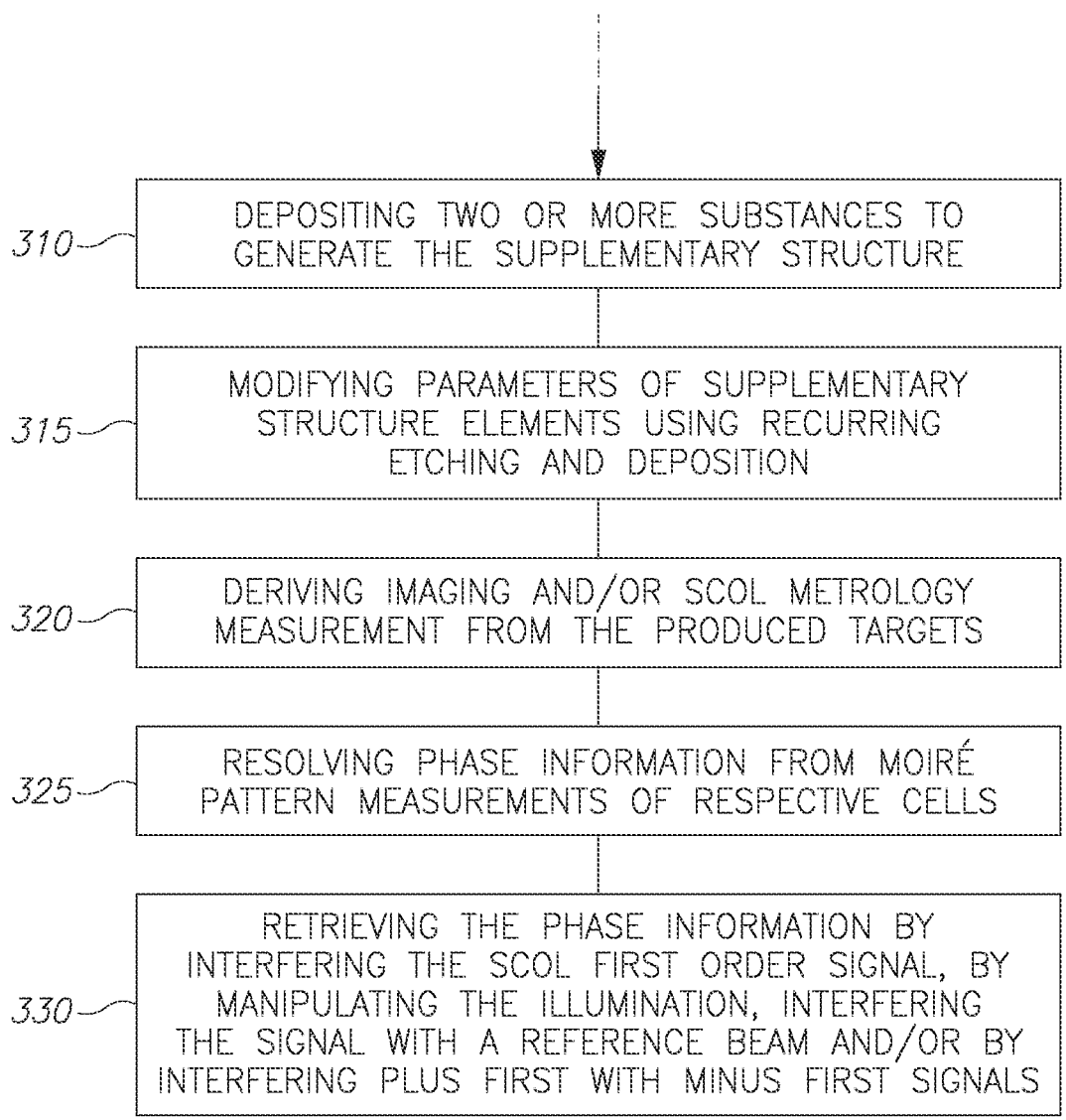
Figure 6 (cont. 3)

DEVICE-LIKE METROLOGY TARGETS

CROSS REFERENCE TO RELATED APPLICATIONS

This application is a divisional application of U.S. patent application Ser. No. 16/719,226 filed on Dec. 18, 2019, which is a continuation application of U.S. patent application Ser. No. 15/442,111 filed on Feb. 24, 2017, which claims the benefit of U.S. Provisional Patent Application No. 62/462,877 filed on Feb. 23, 2017, and of U.S. Provisional Patent Application No. 62/442,226 filed on Jan. 4, 2017, which are incorporated herein by reference in their entireties.

BACKGROUND OF THE INVENTION

1. Technical Field

The present invention relates to the field of metrology, and more particularly, to design, production and measurement of device-like metrology targets.

2. Discussion of Related Art

As device production processes advance, metrology copes with smaller device details which limit significantly the available overlay budget. Hence new types of targets are required to enable reliable and accurate metrology measurements of small device details.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides a metrology target comprising, between a bottom layer and a top layer each having a corresponding periodic structure, at least one supplementary structure configured to interact optically with at least one of the bottom periodic structure and the top periodic structures.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIGS. 1A-1D are high level schematic cross section illustrations of multi-layered target structures, according to some embodiments of the invention.

FIGS. 2A and 2B are high level schematic illustrations of targets that generate Moiré patterns, according to some embodiments of the invention.

FIGS. 3A-3H are high level schematic illustrations of target structures and configurations, according to some embodiments of the invention.

DETAILED DESCRIPTION OF THE INVENTION

Figure 3A:
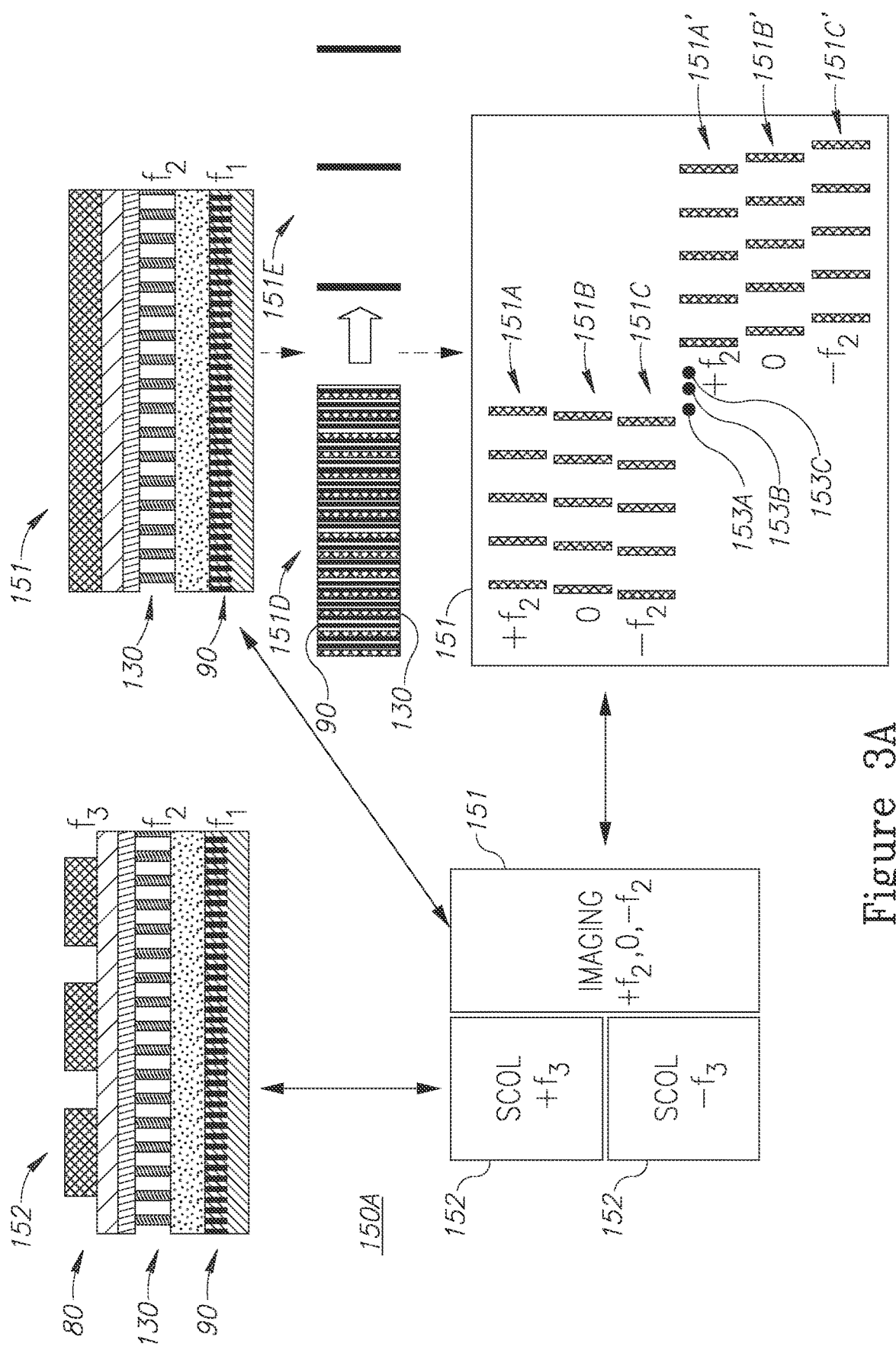

Prior to the detailed description being set forth, it may be helpful to set forth definitions of certain terms that will be used hereinafter.

The term "layer" as used in this application refers to any target layer produced in the photolithography process such as a polysilicon layer, a contact layer, a resist etc. The term "structure" as used in this application refers to any kind of designed or produced structure in at least one layer of a metrology target. The term "periodic structure" as used in this application refers to any kind of designed or produced structure in at least one layer which exhibits some periodicity. The periodicity is characterized by its pitch, namely its spatial frequency. Elements of the periodic structure may be segmented, i.e., comprise segments that reduce the size of the minimal target feature. An example for a typical periodic structure is a grating. It is noted that periodic structures may represent device elements, or may be device elements.

The term "metrology target" as used in this application refers to a structure that is used to derive measurements that are indicative of production parameters such as overlay between layers, structure dimensions and any other accuracy merits. Metrology targets may be dedicated structures which are produced for conducting metrology measurements thereupon, or may at least in part comprise actual device elements, that are used to derive measurements at certain production steps. The terms "bottom layer", "previous layer", "top layer and "current layer" as used in this application refer to a layer (bottom, or previous) in the metrology target which is deeper and earlier produced than another layer (top, or current) in the target structure. The term "supplementary structure" as used in this application refers to any structure which is added to a design of a metrology target. Supplementary structure may be or comprise periodic structures but are not necessarily periodic, and may be designed and produced in any target layer, including the top and bottom layers and above or below these, respectively. The term "intermediate layer" as used in this application refers to a structure produced in lithography step at a layer that is different from the bottom or top layers. The intermediate layer is illustrated in the following to be between the bottom and top layers. While the illustrations depict supplementary structures as for the sake of simplicity, it is emphasized that the supplementary structure(s) may be not intermediate and/or not periodic, as explained below. In certain embodiments, the supplementary structure(s) may be at the same layer as the previous or current layers. It is noted that same numerals are used to denote a layer and a respective structure in the layer, in order to simplify the explanations.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

Metrology targets, production processes and optical systems are provided, which enable metrology of device-like targets. Supplementary structure(s) may be introduced in the target to interact optically with the bottom layer and/or with the top layer of the target and target cells configurations enable deriving measurements of device-characteristic features. For example, supplementary structure(s) may be designed to yield Moiré patterns with one or both layers, and metrology parameters may be derived from these patterns. Device production processes were adapted to enable production of corresponding targets, which may be measured by standard or by provided modified optical systems, configured to enable phase measurements of the Moiré patterns.

While it was suggested in the past to create Moiré patterns using the top and the bottom gratings of overlay targets, the signal of prior art structures was often insufficient for optical far-field measurements since the evanescent modes of each grating in this approach decay exponentially and result in weak signals at most due to the large optical path between the gratings (in the order of hundreds of nm or more).

Advantageously, the metrology targets enable overlay (OVL) and\or critical dimension (CD) measurement of device patterns, as well as sensitive pitch walk measurements, using intermediate lithography step(s) that are part of the process flow. The targets utilize the strong near field interaction between the previous layer and intermediate layer to yield detectable signals, and enable the previous layer pattern to be much smaller than typical optical resolution limit. These targets thus improve the correlation to the device and the process compatibility.

FIGS. 1A-1D are high level schematic cross section illustrations of multi-layered target structures 150, according to some embodiments of the invention. Targets 150 may comprise a bottom layer having a bottom periodic structure 90, a top layer having a top periodic structure 80 and supplementary structures 110, 130 configured to interact optically with at least one of bottom periodic structure 90 and top periodic structure 80. Any number and types of layers 93 may be included in targets 150. Supplementary structures 110, 130 may be periodic, comprise periodic elements and/or be non-periodic.

Supplementary structure(s) 110, 130 may be designed to improve the process robustness of the targets (CMP—chemical mechanical planarization). For example, structure(s) 110 and/or 130 may be segmented orthogonally to structures 80, 90 to minimize their effect on the metrology measurements. In certain embodiments, structure(s) 110 and/or 130 may be designed to improve metrology measurements by any of: (i) maximizing signal transmission from bottom layer 90, (ii) preventing signal transmission from below layer 110, (iii) optimizing the bottom and top layers interference signal in SCOL targets, (iv) interacting optically with any or both periodic structures 90, 80, e.g., by generating Moiré pattern(s) therewith, and specifically enabling metrology measurement of small scale details like device elements, at least in bottom layer 90, (v) interacting optically with any or both periodic structures 90, 80 to yield Moiré pattern(s) in two directions, enabling simultaneous measurements of overlay and CD (critical dimension), and (vi) functioning as an apodizer to reduce finite target size effects. Some of these possibilities are exemplified in more details below.

FIG. 1A for example, illustrates the supplementary structure as intermediate layer 110 designed as a blocking layer or barrier layer that removes disturbances from lower layers 93 (and specifically 90) to metrology measurements of target elements above barrier layer 110. Barrier layer 110 may enable re-using a given area for multiple measurements of different layer and different overlays without disturbances from structures which were previously measured.

FIG. 1B, in another example, schematically illustrates supplementary structure 130 which may interact optically with bottom periodic structure 90 and/or with top periodic structure 80. In the illustrated example, bottom layer has small scale details (e.g., tens of nm), e.g., device or device-like features, while top layer has larger scale details (e.g., hundreds of nm), typical for providing optical metrology measurements. Supplementary structure 130 may be designed at a scale similar to bottom periodic structure 90 and to interact optically therewith. Simulations with various top layer CD and intermediate layer space CD's have shown sensitivity of the overall metrology measurements of targets 150 to structure details of bottom periodic structure 90, i.e., to details in the scale of several tens of nm. In the simulated example, the pitches of structures 90, 130 were 80 nm and 90 nm respectively and the pitch of structure 80 was 720 nm.

FIGS. 1C and 1D schematically illustrate bottom layer periodic structure 90 comprising multiply patterned elements 109 which are produced in multi-patterning steps (i.e., elements produced by double, quadruple or generally multiple patterning), for example—finFET ("fin" field effect transistor) elements, which may have an even smaller pitch of few tens of nm. FIG. 1C and FIG. 1D illustrate examples of multiply patterned elements 109 (as finFETs) produced by quadruple patterning and exhibiting a periodicity in groups of four elements 109. Using a cut process, fin elements 109 may be remove selectively and periodically, e.g., in FIG. 1C every fifth fin element is removed (the gap being marked 109A) while in FIG. 1D every fourth fin is removed 109A. Supplementary structure 130 may be configured to interact optically with bottom multiply patterned (e.g., finFET) periodic structure 90 and enable optical metrology measurements thereof. In certain embodiments, target 150 may comprise four cells, wherein in each of the cells a different element in each repeating group is removed 109A, to enable measuring the inaccuracy in the production of each aspect of the patterning process separately. Simulations have shown that the resulting measurements are sensitive to the placement error of selected missing elements 109A, e.g., when respective Moiré patterns are generated by appropriately designed intermediate layer 130. In the simulated example, the CD of finFET elements 109 was 10 nm and their pitch was in the order of 40 nm.

Hence, in certain embodiments, bottom layer 90 of targets 150 may comprise a plurality of periodic multiply patterned elements 109, produced in multiple patterning steps, with which supplementary structure 130 is configured to interact optically. Elements 109 may comprise recurring sets of corresponding elements 109, and target 150 may comprise multiple cells, each lacking a different one of the elements (109A) in the recurring set. Multiply patterned elements 109 may be FinFET elements.

FIGS. 2A and 2B are high level schematic illustrations of targets 150 that generate Moiré patterns, according to some embodiments of the invention. FIGS. 2A and 2B present schematic cross section illustrations of imaging targets 151 and SCOL targets 152 (e.g., first order SCOL) respectively, as examples for targets 150. It is explicitly noted, that while in the illustrated examples, supplementary structure s 130 are physically between top and bottom periodic structures 80, 90, supplementary structures 130 may as well be located below bottom periodic structures 90, and even may be part of the lowest silicon layer.

In certain embodiments, bottom and top periodic structures 90, 80 respectively, have a same pitch (P) and supplementary structure 130 may be a periodic structure having a pitch (P+ΔP) that is different from the same pitch (P) to an extent that generates a detectable Moiré pattern between periodic structures (90, 130 and 80, 130).

Corresponding Moiré patterns may be generated using supplementary structure 130 (e.g., having a silicon grating) for measuring overlay between layers 80, 90. Targets 150 may overcome the difficulty that introducing supplementary structure 130 potentially involves new unknown parameter(s) like the overlay between supplementary structure 130 and other layers 93, including periodic structures 80, 90. Thus, while supplementary structure 130 may help in pitch reduction, it may require additional cells and additional measurements to determine its overlay. However, the proposed solution, in which supplementary periodic structure 130 creates Moiré patterns with both bottom and top periodic structures 90, 80 by having pitch P+ΔP which is slightly different (larger or smaller) from pitches P of bottom and top periodic structures 90, 80.

In certain embodiments, target 150 may be configured as imaging target 151 having at least a first cell 151A with top and supplementary structures 80, 130 respectively, and a second cell 151B with bottom and supplementary structures 90, 130 respectively. While pitches P and P+ΔP may be unresolved, Moiré pitch P(P+ΔP)/ΔP may well be resolved by metrology tools. Denoting the position of the resist grating (top periodic structure 80) as UG (for "upper grating"); the position of the process layer grating (bottom periodic structure 80) as BG (for "bottom grating"); and the position of supplementary structure 130 (which may be below bottom periodic structure 90) as IG (for "intermediate grating", in a non-limiting manner)—two overlays may be defined, namely OVL1=UG-BG (which is the value the metrology intends to report) and OVL2=UG-IG (which is a byproduct of the target design). Considering a simplified model with only 0 and ±1 diffraction orders and normal illumination, noting that the most general case yields similar results, measuring first cell 151A provides a sum of zero and first diffraction orders with the difference of topographic phases between zero and first diffraction orders being denoted as Ψ. First diffraction orders with effective pitch are the result of double scattering on intermediate (supplementary) and resist layers (130, 80 respectively, top layer 80 is also termed resist or coarse pitch layer), i.e., +1 coarse diffraction order=+1 resist diffraction order and −1 intermediate diffraction order and vice versa, as expressed in Equation 1:

$$E \cong e^{ikx\sin(\theta_0)}\left(A_0 e^{i\Psi} + A_1 \cdot e^{i\frac{2\pi}{P}(x-UG)-i\frac{2\pi}{P+\Delta P}(x-IG)} + \right.$$

$$\left. A_1 \cdot e^{-i\frac{2\pi}{P}(x-UG)+i\frac{2\pi}{P+\Delta P}(x-IG)}\right) = e^{ikx\sin(\theta_0)}$$

$$\left(A_0 e^{i\Psi} + 2A_1 \cos\left[\frac{2\pi\Delta P}{P(P+\Delta P)}x - \frac{2\pi}{P}UG + \frac{2\pi}{P+\Delta P}IG\right]\right)$$

Equation 1

Substituting IG=UG-OVL2, the measured signal is a function of $$x - UG - OVL2\frac{P}{\Delta P},$$

i.e., may be denoted as $$F_1\left(x - UG - OVL2\frac{P}{\Delta P}\right).$$

For second cell 151B, similar considerations yield Equation 2:

$$E = e^{ikx\sin(\theta_0)}\left(B_0 + \right.$$

$$\left. B_1 \cdot \cos\left[-\frac{2\pi}{P}BG + \frac{2\pi}{P+\Delta P}IG + 2\pi x\frac{\Delta P}{P(P+\Delta P)}\right]\right) ==$$

$$e^{ikx\sin(\theta_0)}\left(B_0 + B_1 \cdot \cos\left[-\frac{2\pi}{P}UG + \frac{2\pi}{P}OVL1 + \right.\right.$$

$$\left.\left. \frac{2\pi}{P+\Delta P}IG + 2\pi x\frac{\Delta P}{P(P+\Delta P)}\right]\right)$$

Equation 2

Substituting IG=UG-OVL2 and BG=UG-OVL1, the measured signal is a function of $$x - UG - OVL2\frac{P}{\Delta P} + OVL1(P+\Delta P)/\Delta P,$$

i.e., may be denoted as $$F_2\left(x - UG - OVL2\frac{P}{\Delta P} + OVL1(P+\Delta P)/\Delta P\right).$$

The difference between the two cell measurement functions depends only on OVL1 (and not on IG) and therefore overlay may be expressed as $$OVL = -\frac{\Delta P}{P+\Delta P} \cdot \text{Distance},$$

with Distance being the difference in the OVL as measured using the two cells 151A, 151B.

In certain embodiments, target 150 may be configured as scatterometry overlay (SCOL) target 152 comprising bottom, intermediate and top layers 80, 130 and 90 respectively, in at least one cell. In this case, the first order signal in the pupil, for example, may be expressed by Equation 3:

$$E = e^{ikx\sin(\theta_0)}\left(A_1 \cdot e^{i\frac{2\pi}{P}UG - i\frac{2\pi}{P+\Delta P}IG} + B_1 \cdot e^{i\frac{2\pi}{P}BG - i\frac{2\pi}{P+\Delta P}IG}\right)$$

In this case the measured signal (which is the intensity) doesn't depend on position of intermediate grating 130 at all.

These derivations provides a large flexibility in positioning supplementary structure(s) 130, while enabling the use of supplementary structure(s) 130 in bridging small scale device features and the larger scale required for optical metrology measurements.

FIGS. 3A-3H are high level schematic illustrations of target structures and configurations, according to some embodiments of the invention. FIGS. 3A-3H schematically illustrate targets 150A-H respectively and include both cross sectional illustrations as well as high level cells organization of targets 150.

Certain embodiments comprise metrology targets 150 comprising at least two SCOL cells 152 having opposite designed offsets ($+f_3$, $-f_3$) between top periodic structure 80 and bottom periodic structure 90 and at least one imaging cell 151 lacking top periodic structure 80 and having at least three supplementary structures 130, two of which having opposite offsets ($+f_2$, $-f_2$) and one of which having no offset (0) of supplementary structure 130 with respect to bottom periodic structure 90.

Supplementary structure(s) 130 may be configured to yield Moiré patterns 151E by optical interaction with corresponding bottom periodic structures 90, which are measured with respect to corresponding top periodic structures 80. The formation of Moiré patterns 151E is illustrated schematically in a top view 151D of structures 90, 130 and the resulting optical interaction 151E between them.

FIG. 3A schematically exemplifies targets 150A having SCOL cells 152 with layers 90, 130, 80 and imaging cells 151 with layers 90, 130, according to some embodiments of the invention. SCOL cells 152 may be measured to find the overlay between top periodic structure 80 (e.g., a resist layer) and the Moiré pattern resulting from the optical interactions of layers 90, 130, while imaging cell(s) 151 may be used to determine the overlay between supplementary structure(s) 130 and bottom periodic structure 90. Imaging cells 151 are exemplified in a non-limiting manner in an AIM (advanced imaging metrology) design having three pairs of cells: 151A and 151A' with offset $+f_2$, having center 153A; 151B and 151B' with offset 0, having center 153B; and 151C and 151C' with offset $-f_2$, having center 153C. Imaging cells in a perpendicular direction may be added to the design. It is noted that other layers 93 including the top layer may have structure, but such which do not interfere optically with supplementary structures 90, 130. The overlay between supplementary structure 130 and periodic structure 90 can be extracted from these three centers (for example, if 153C-153B=153B-153A then OVL=0).

In certain embodiments, imaging cell(s) 151 may be measured prior to production of top layer 80, i.e., prior to production of top periodic structure 80, e.g., after the etch of supplementary structure 130, while SCOL cells 152 may be measured after production of top periodic structure 80 for the overlay between structure 80 and Moiré pattern 151C (which is measured directly using imaging cells 151).

FIG. 3B schematically exemplifies targets 150B having imaging cells 151 with layers 90, 130, 80, according to some embodiments of the invention. Certain embodiments comprise metrology targets 150 comprising at least one imaging cell 151 having at least three supplementary structures 130, two of which having opposite offsets ($+f_2$, $-f_2$) and one of which having no offset (0) of supplementary structure 130 with respect to bottom periodic structure 90. For example, imaging cells 151 may be organized as illustrated in FIG. 3A.

It is noted that in certain embodiments, the OVL measurements between 80 and 90 may be replaced by any arrangement which conveys phase information (see e.g., FIGS. 5A-5D below) such as interfering two diffraction orders (e.g., zeroth and first orders), e.g., by using finite elements along the optical axis such as a specified finite field stop a specified finite cell size etc.

FIG. 3C schematically exemplifies targets 150C having imaging cells 151A, 151B relating to different Moiré patterns, according to some embodiments of the invention. Each of at least two imaging cells 151 may have at least three supplementary structures 130, two of which having opposite offsets and one of which having no offset of supplementary structure 130 with respect to bottom periodic structure 90, wherein in one of imaging cells 151, supplementary structure 130 may be configured to form a detectable Moiré pattern with bottom periodic structure 90 and in another one of imaging cells 151, supplementary structure 130 may be configured to form a detectable Moiré pattern with top periodic structure 80.

In certain embodiments, supplementary structure 130 can interfere with top periodic structure 80 to form one Moiré pattern (e.g., having pitch $P_2$) as well as with bottom periodic structure 90 to form another Moiré pattern (e.g., having pitch $P_1$), as illustrated schematically in FIG. 3C. Different illumination wavelengths and/or apodizations and/or illumination angles may be selected to determine which of the modes propagates and accordingly which Moiré pitch is measured. Different imaging cells 151A, 151B may be designed to enable measurement of different Moiré pitches $P_1$, $P_2$ in different cells 151A, 151B, for example by measuring $P_1$ before production of layer 80 and/or using barrier layer 110 above bottom layer 90 before measuring $P_2$. Alternatively or complementarily, the measurement system may be configured to separate pitches $P_1$, $P_2$ at the image plane. Given and unknown overlay, designed offsets between layers 90, 130, 80 may be designed to enable at least three measurements, form which the unknown overlay may be extracted.

FIGS. 3D and 3E schematically illustrates targets 150D, 150E being arrays of imaging cells, according to some embodiments of the invention. In certain embodiments, metrology target 150 may comprise an array of imaging cells, each cell having different combinations of designed offsets $±f_2$, $±f_3$ between top, intermediate and bottom periodic structures 80, 130, 90. Array 150D may comprise at least nine cells 152A-J with all combinations of opposite and zero designed offsets, $±f_2$, $±f_3$, 0, between the layers. Array 150E may comprise at least five cells 152A-E, each cell having no offset or a single one of opposite offsets $±f_2$, $±f_3$, 0, between bottom periodic structure 90 and one of intermediate and top periodic structures 130, 80, respectively. As before, different illumination wavelengths and/or apodizations and/or illumination angles may be selected to determine which of the modes propagates and accordingly which Moiré pitch is measured.

FIG. 3F schematically exemplifies targets 150F having SCOL cells 152 and an imaging cell 151 for measuring offsets with respect to finFET elements, according to some embodiments of the invention. Bottom periodic structure 90 may be created using multiple lithography steps (for example: Self-Aligned Quadruple Patterning—SAQP and cut).

FIG. 3G schematically exemplifies targets 150G having two imaging cells 151A, 151B, according to some embodiments of the invention. In certain embodiments, metrology target 150 may comprise at least two imaging cells 151A, 151B, each having at least three supplementary structure s 130, two of which having opposite offsets ($\pm f_2$, $\pm f_3$), and one of which having no offset (0) of supplementary structure 130 with respect to bottom periodic structure 90. In one of imaging cells 151B the offset ($\pm f_2$) is between supplementary structure 130 and bottom periodic structure 90 and in another one of imaging cells 151A the offset ($\pm f_3$) is between top periodic structure 80 and bottom periodic structure 90.

FIG. 3H schematically exemplifies targets 150H having two pairs of SCOL cells 152A, 152B, according to some embodiments of the invention. Metrology target 150 may comprise at least two SCOL (e.g., first order SCOL) cell pairs 152A, 152B having opposite designed offsets, one pair 152A having the designed offsets ($\pm f_3$) between top periodic structure 80 and bottom periodic structure 90, and another pair 152B lacking top periodic structure 80 and has the designed offsets ($\pm f_2$) between supplementary structure 130 and bottom periodic structure 90. In order to measure the latter, a modified optical system may be used, for example, modified optical systems disclosed below, e.g., in FIGS. 5A-5D.

FIGS. 4A-4D are high level schematic illustrations of production procedures 160, according to some embodiments of the invention. Device production procedures 160 (e.g., multiple patterning procedures) may be configured to enable production of any of targets 150 and in particular of supplementary structure 130, possibly without adding lithography steps to the device manufacturing process. It is noted that while supplementary structure(s) 130 are illustrated in FIGS. 4A-4D as intermediate layers 130, supplementary structure(s) 130 may also be produced at the same physical layer as bottom or top layers 90, 80 (respectively) and/or below bottom layer 90 or above top layer 80. In certain embodiments, several supplementary structures 130 may be produced. It is further noted that supplementary structures 130 may but must not be periodic.

Figure 4A:
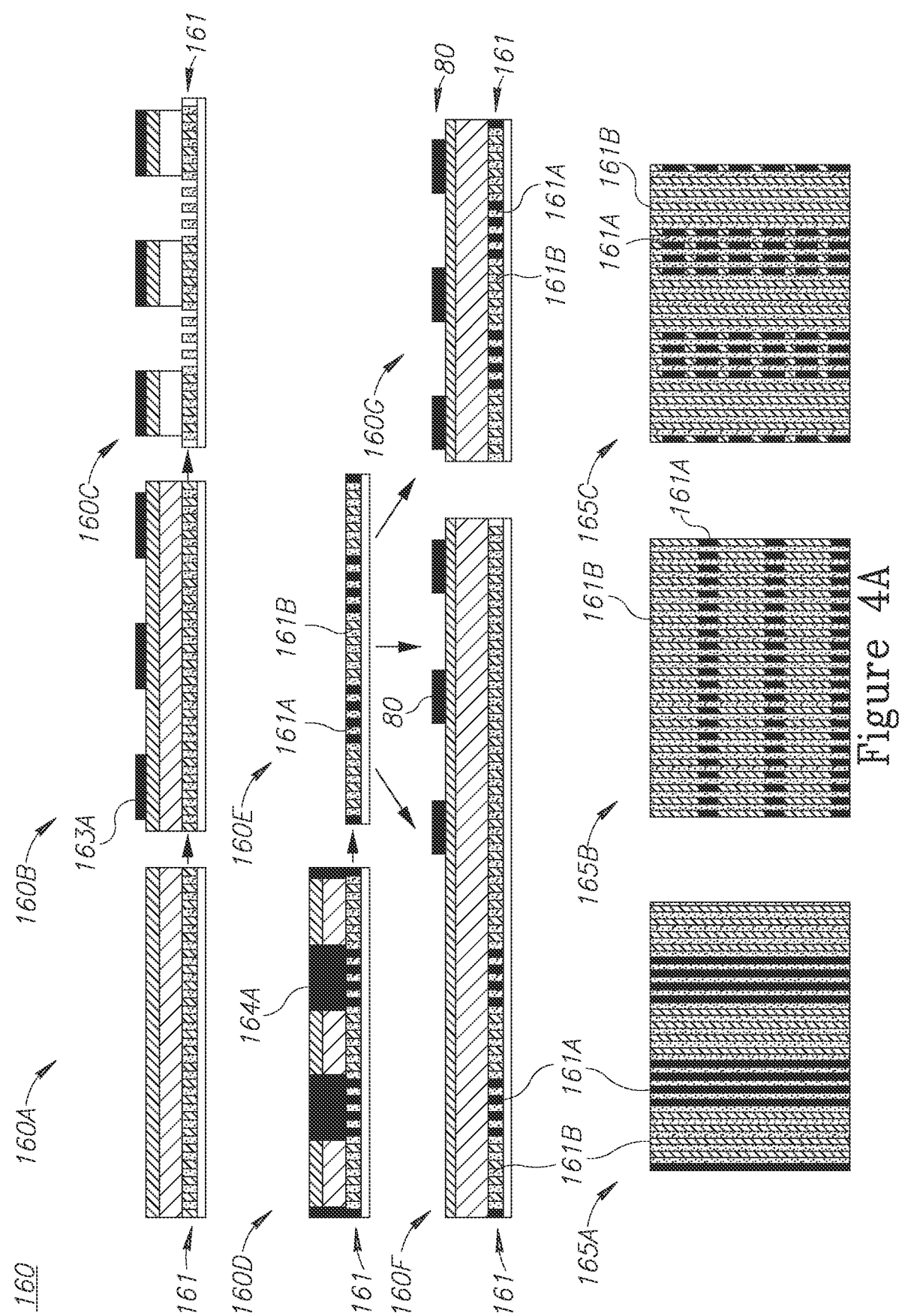
FIGS. 4A-4D are high level schematic illustrations of production procedures, according to some embodiments of the invention.

FIG. 4A schematically illustrates the use of selective etch of device pattern followed by deposition in to enable measurements of device edges, according to some embodiments of the invention. The additional deposition is needed in order to enable the measurements by deposing material with different optical properties. Exemplary production procedures 160 comprises the following steps:

Starting (160A) with a pad with a periodic structure 161 (such as a device grating, e.g., finFET elements with minimal pitch), lithography steps (160B) may involve placing, exposing and developing resist 163A with a pitch which is resolved by metrology. Then, etch steps 160C follow (possibly several process steps) in which resist pattern 163A is moved to the previous layer pattern, including periodic structure 161. The last step of etch steps 160C may be a selective etch which removes only one material from the bottom grating (periodic structure 161). Then, the etched volumes may be filled with material 164A which has significantly different optical properties that the etched out material(s) in the bottom layer (160D) and the layers above the bottom grating may be removed (160E), e.g., employing planarization. Remaining structures 161A, 161B may be made of different materials. Following depositions of additional layers, imaging targets may be produced (160F) by placing, exposing and developing a resist pattern for the current layer (80) on top of a pad next to the pad processed in steps 160A-E, and/or scatterometry targets may be produced (160G) by placing, exposing and developing a resist pattern for the current layer (80) on top of the pad processed in steps 160A-E. It is noted that production procedures 160 may be modified to yield various patterning options 165A, 165B, 165C, depending on the parameters and directions of original periodic structure 161 and of resist pattern 163A deposited in step 160B.

It is emphasized that production procedures 160 utilize the selective etch and deposition steps which are part of the device lithography process—to create metrology targets, so that the metrology target edges in one direction are defined by the device edges and generally to improve the process compatibility of metrology targets 150.

Figure 4B:
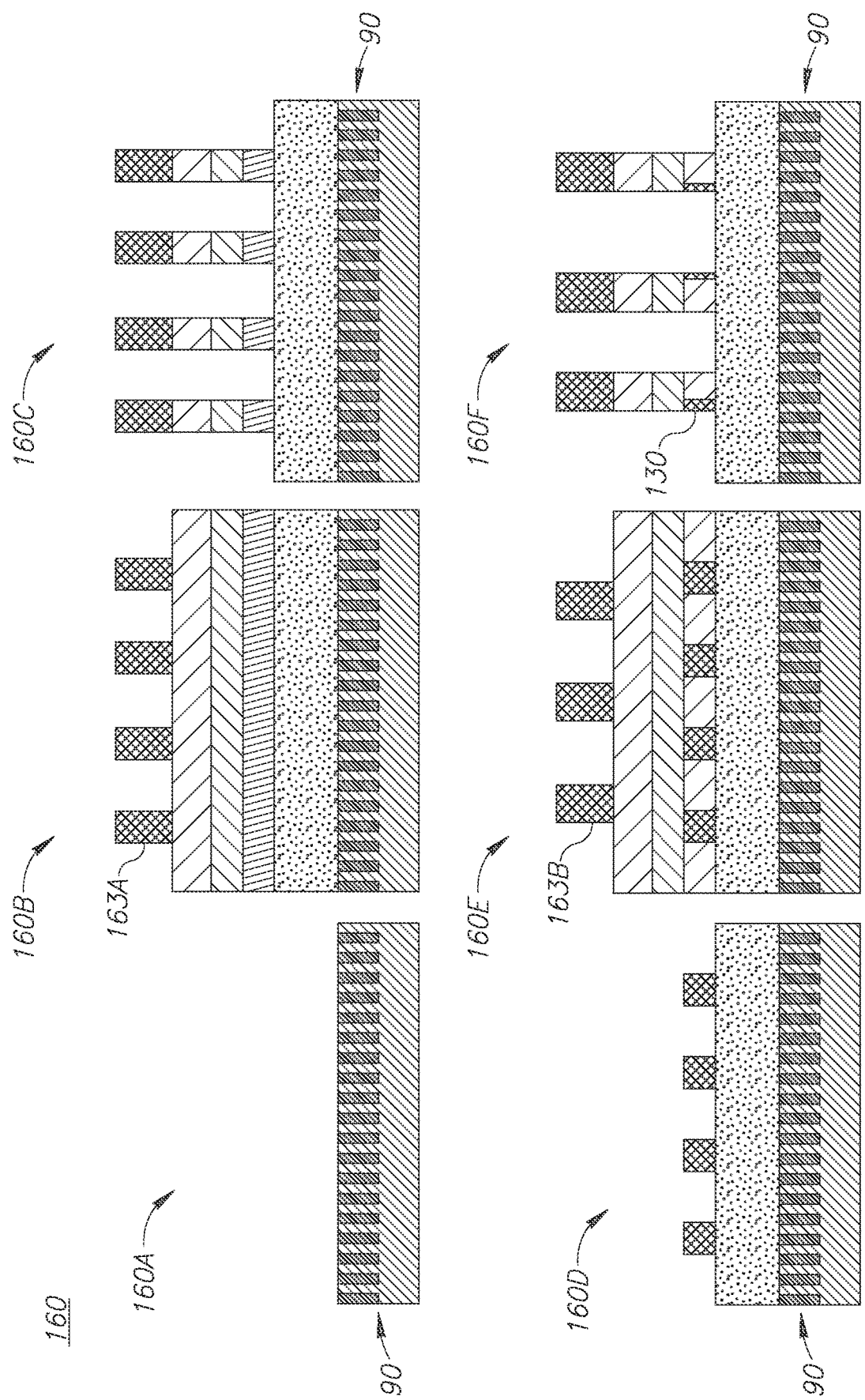

FIG. 4B schematically illustrates the use of an additional hard mask 163B in enabling measurements of the overlay between bottom periodic structure 90 representing or actually being the device pattern, and current layer pattern 163B. The measurement may be incorporated as part of the device production process, e.g., as part of Litho-Etch-Litho-Etch (LELE) production procedure 160 which is identical to the device production flow, according to some embodiments of the invention. Supplementary (intermediate) layer 130 with supplementary structures may be produced above bottom layer 90 and have a pitch which is selected to interact optically with bottom structure 90 and/or top structure 80 (illustrated as mask 163B in FIG. 4B).

Figure 4C:
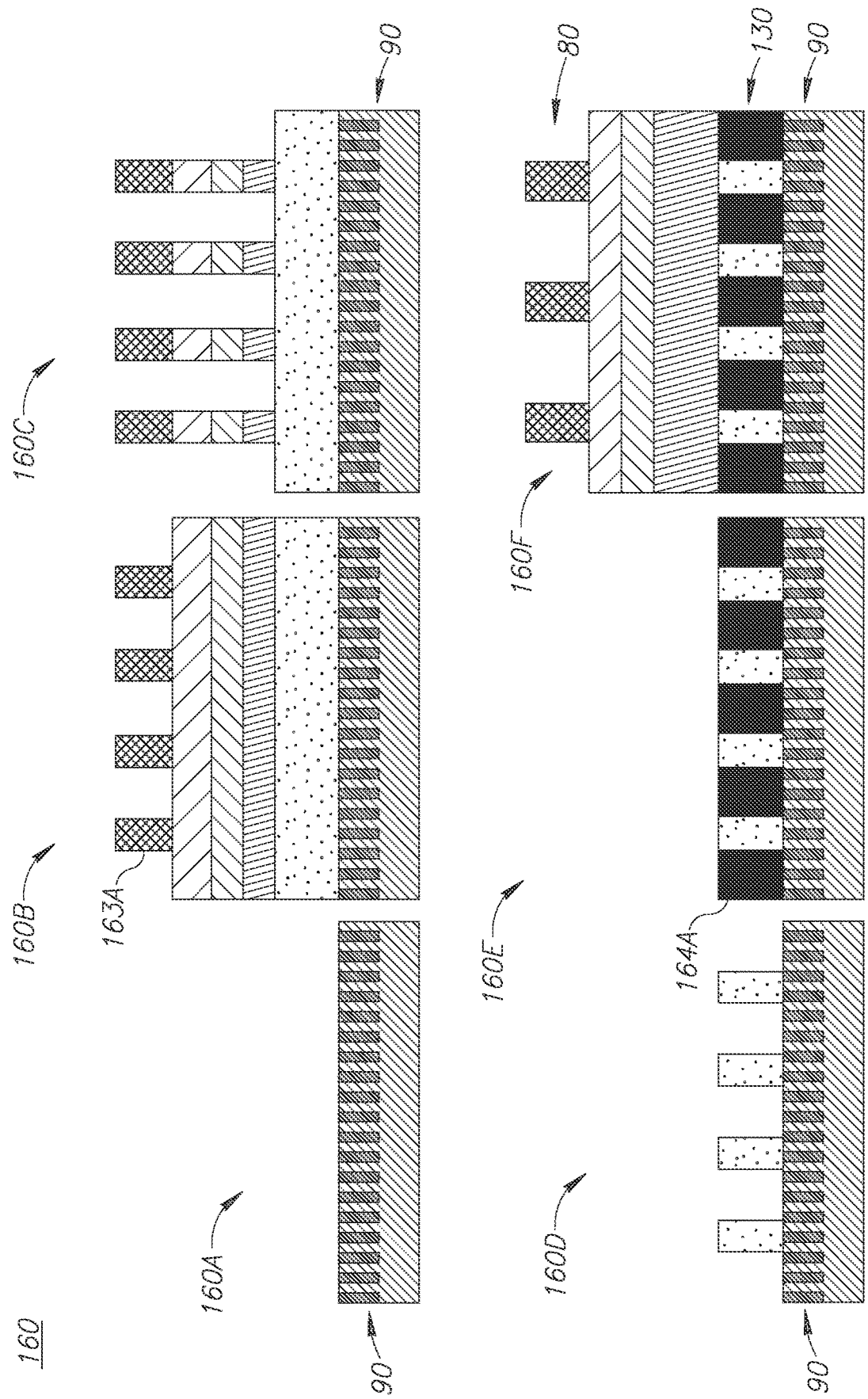

FIG. 4C schematically illustrates creating supplementary structure 130 by production procedures 160, according to some embodiments of the invention. Following the application of mask 163A (160B-C, comprising depositing the mask and removing material volumes which are not protected thereby, respectively) to produce one type of material in intermediate layer 130 (160D), spaces between the elements are filled with a second material 164A (160E) and finally top layer 80 is deposited, possibly after measurements of supplementary structures 130 and bottom layer 90, as explained above. It is noted that in standard metrology targets there is no pattern in intermediate layer 130 (of second material 164A).

Figure 4D:
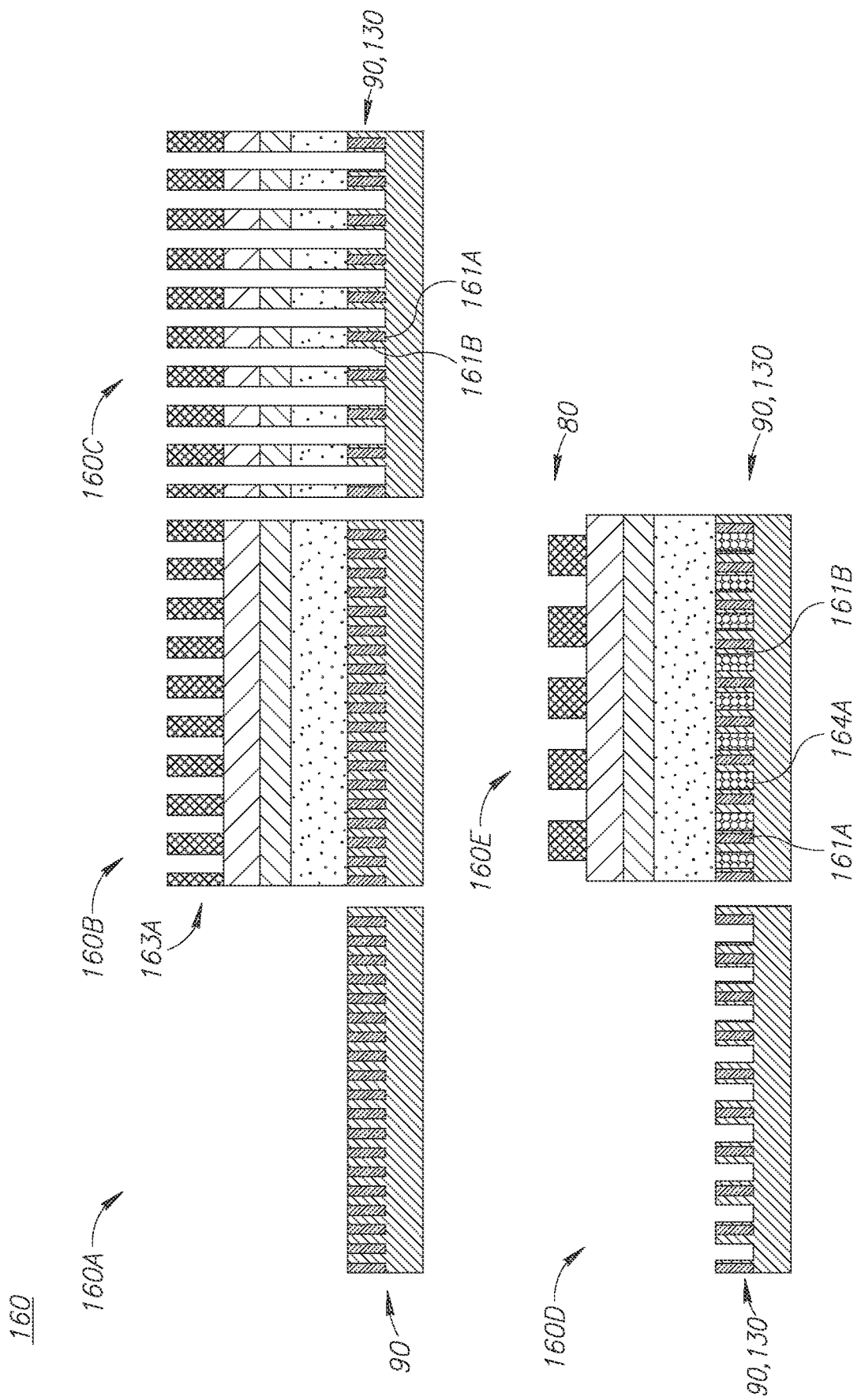

FIG. 4D schematically illustrates creating a single layer, comprising both bottom periodic structure 90 and supplementary structure 130, and exhibiting a Moiré pattern upon optical measurement, according to some embodiments of the invention. The single layer may be produced using multiple lithography steps 160A-E, e.g., lithography and cut step(s) or LELE in production procedures 160. For example, the process may be designed to yield elements 161A of bottom periodic structure 90 and filling elements 161B that define the positions for elements 164A of supplementary structure 130. In certain embodiments, the single layer may comprise supplementary structure(s) 130 made of a material 164A that is different from the material of bottom periodic structure 90.

It is noted that even though the illustrations in FIGS. 4B and 4D may suggest that structure 164A may violate some design rules (such as minimal tip to tip distance), this issue may be easily resolved by choosing the proper pitches for structure 130 in FIG. 4B and for structures 130 and 90 in FIG. 4D.

Advantageously, production procedures 160 overcomes inaccuracies involved in current metrology targets which have target dimensions different from device dimensions, such as their different response to scanner aberrations and to other variables of the manufacturing process which may affect the overlay, the geometry, LER (line edge roughness) etc.

FIGS. 5A-5D are high level schematic illustrations of optical systems 170 which may be used to measure targets 150, according to some embodiments of the invention. Optical systems 170 are designed to derive phase information, e.g., from targets 150, of Moiré patterns generated by targets 150, and in certain cases in place of SCOL cells 152. It is noted that in the far field overlays in Moiré patterns may result in phase differences rather than intensity differences between the 1st and −1st diffraction orders, and hence, phase information may be preferable to direct 1st order SCOL measurements. Illustrated optical systems 170 demonstrate, in a non-limiting manner, implementations for interfering diffraction orders in order to extract phase information they carry.

Optical systems 170 comprise an illumination source 61, illumination field stop and lenses 62, beam splitter 65 through which the illumination is delivered to objective 66 and onto target 150 on wafer 60, and then back through optical elements such as lens 68A to detector 69 such as a CCD (charge-coupled device).

Figure 5B:
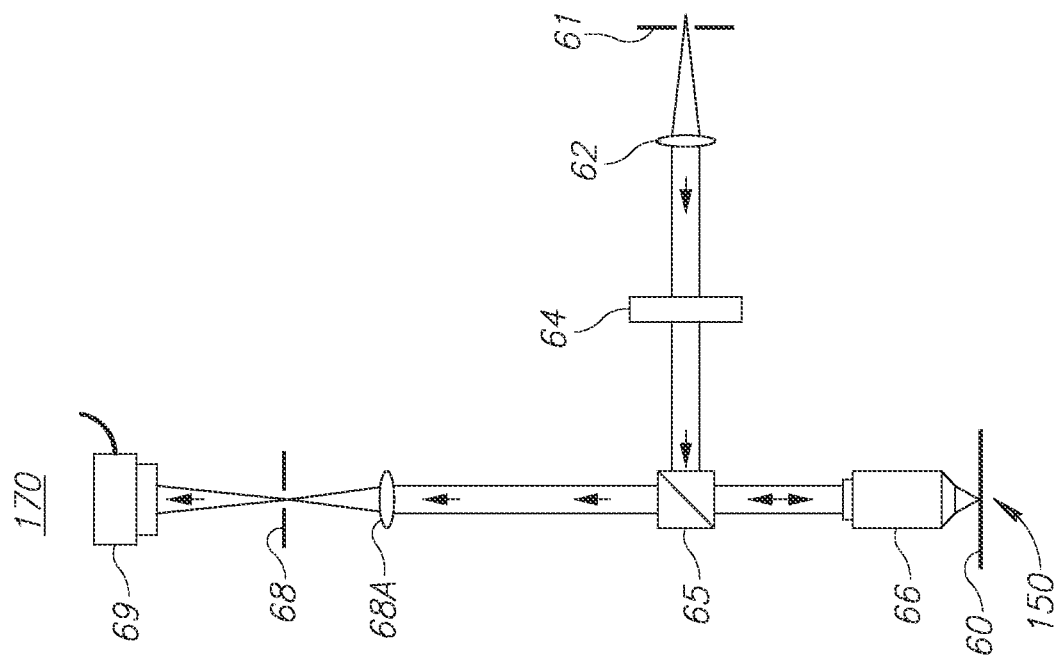
FIGS. 5A-5D are high level schematic illustrations of optical systems which may be used to measure the targets, according to some embodiments of the invention.
Figure 5A:
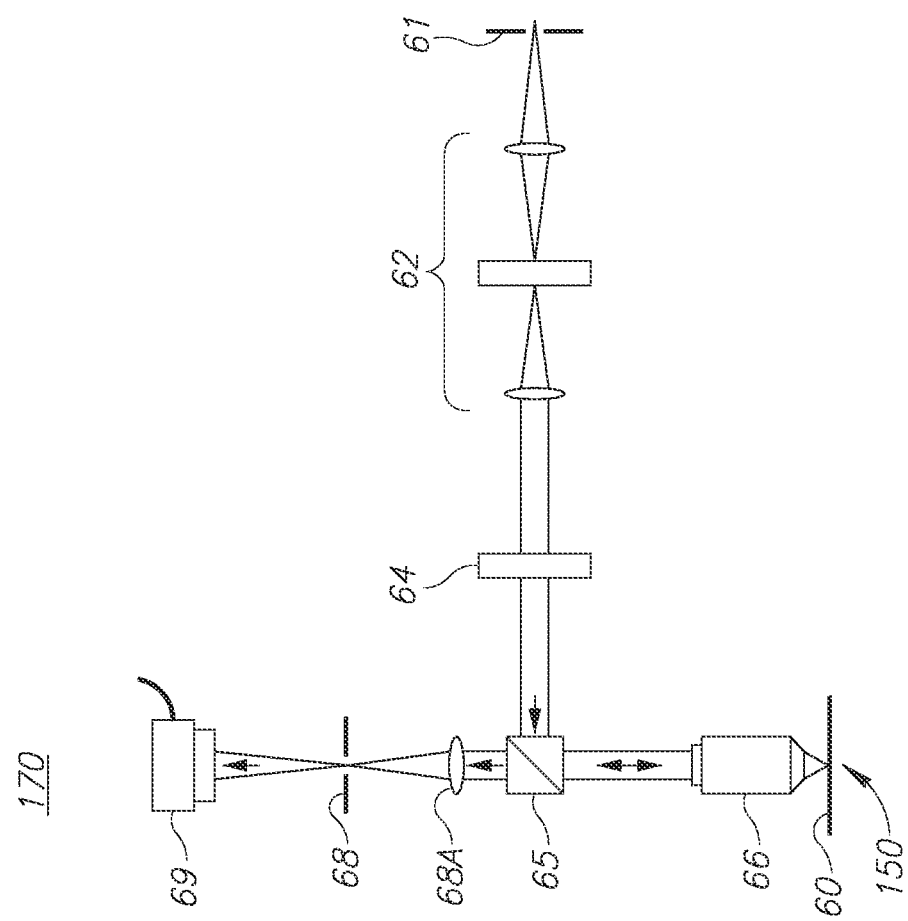

FIGS. 5A and 5B illustrate the use of apodizer 64 and/or finite field stops 68 configured to diffract the orders so that specified orders, e.g., the zeroth and the first orders (+1 or −1) overlap and provide phase information. Any type of apodizer 64 and field stop 68 may be used, e.g., diffractive or transmissive elements. Field stop 62 may be introduced with corresponding optical elements to modify the length of the collection optical pathway.

Certain embodiments comprise metrology optical system 170 comprising at least one of apodizer 64 and field stop 68, configured to interfere the zeroth order reflected diffraction signal with the first order reflected diffraction signal at a pupil plane in which detector 69 is located.

Figure 5C:
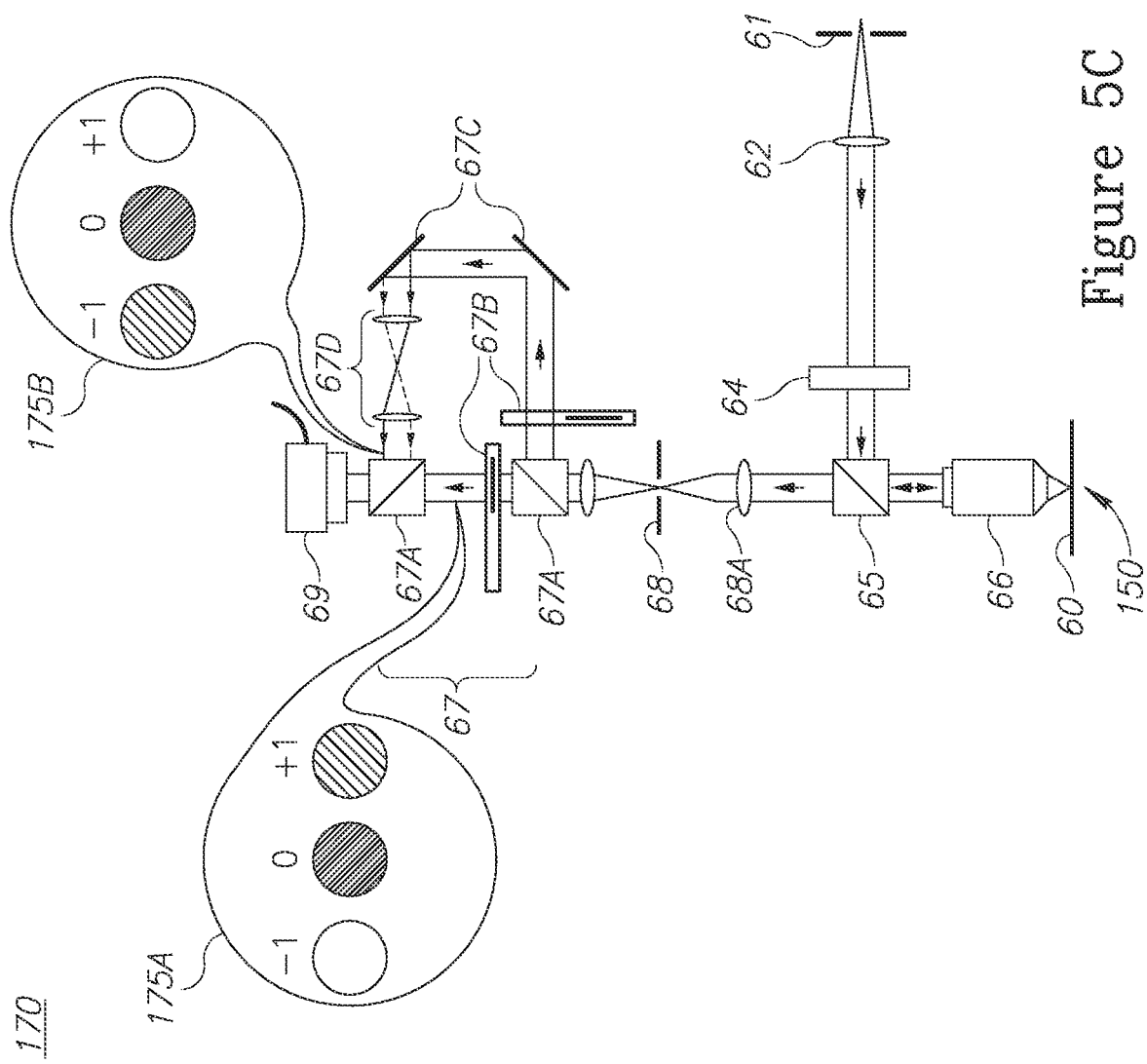

FIG. 5C illustrates exemplary optical system 170 for interfering +1 diffraction order with −1 diffraction order by reflecting the captured beam using optical element 67D (e.g., comprising corresponding lenses) and superposing reflected pupil plane image 175B onto original pupil plane image 175A using beam splitters 67A, mirrors 67C and shutters 67B.

Shutters 67B are used to regulate beam intensities, to correct for beam attenuation during their manipulation (e.g., attenuation of the reflected beam). Specifically, an attenuation factor a can be measured using Equation 4, with $E_R$ and $E_L$ denoting the electric field resulting from each of the optical paths and $(k_x, k_y)$ denoting the pupil coordinates:

$$E_R(k_x,k_y)=\alpha E_L(-k_x,k_y) \qquad \text{Equation 4}$$

The signal resulting from the interference of +1 and −1 orders (which have positive and negative k values, respectively), which depends on the overlay, may be expressed as in Equation 5:

$$E(k_x,k_y)=E_R(k_x,k_y)=\alpha E_R(-k_x,k_y) \qquad \text{Equation 5}$$

The measured intensity $I(k_x, k_y)$ depends of the overlay, as expressed in Equation 6, with $P_1$, $P_2$ denoting the Moiré pitches and $\varepsilon_1$ and $\varepsilon_2$ denoting the lateral position of the first and second gratings:

$$I(k_x,k_y) \approx |E_R|^2\left[1+a^2+2a\cos\left(4\pi\left(\frac{\varepsilon_1}{P_1}-\frac{\varepsilon_2}{P_2}\right)\right)\right] \qquad \text{Equation 6}$$

Equation 6 shows that the measured intensity depends on the OVL (for example, by choosing $\varepsilon_1=0$ and OVL=$\varepsilon_2$, without loss of generality.

Certain embodiments comprise metrology optical system 170 comprising an optical assembly (e.g., beam splitters 67A, shutters 67B, mirrors 67C and optical element 67D) configured to interfere a part of the reflected signal (175A) with a mirror image thereof (175B) to yield, at a pupil plane in which detector 69 is located, an interference of the +1 first order reflected diffraction signal with the −1 first order reflected diffraction signal. In FIG. 5C the location of 67C elements may be modified mechanically to control the optical path. In addition phase modulating element(s) may be added to control the phase of the illumination which is interfered with the signal.

Figure 5D:
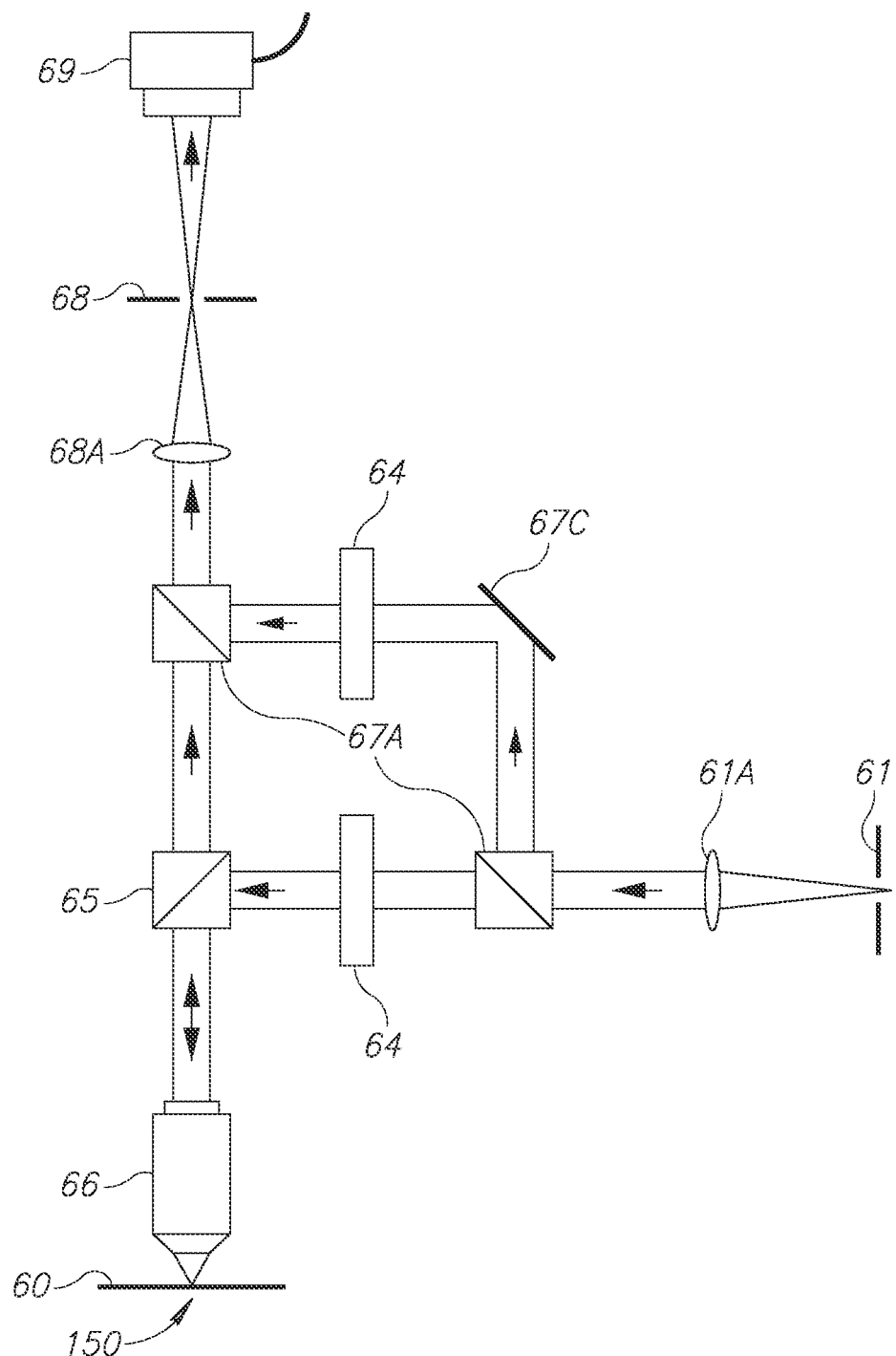

FIG. 5D illustrates exemplary optical system 170 for interfering the pupil signal with a uniform field across the pupil to create overlay sensitivity. In the illustrated example, beam splitters 67A, mirror 67C and attenuator 67E are used to introduce some of the illumination as the uniform field and adjust the intensity thereof, to interfere with the collected signal. In certain embodiments, optical systems 170 may interfere the signal with an external uniform beam (for example, by replacing mirror 67C with an additional illumination source).

Certain embodiments comprise metrology optical system 170 comprising an optical assembly (e.g., beam splitters 67A, mirror 67C and attenuator 67E) configured to interfere a part of the illuminated radiation with the collected signal to derive phase information of the reflected signal.

In certain embodiments, optical system 170 may be configured to measure the metrology signal in a field plane, in which the diffraction orders interfere, to derive the overlay from the phase information contained in this interference. In certain embodiments, optical system 170 may be configured to provide ellipsometry measurements that contain the required phase information.

Figure 6:
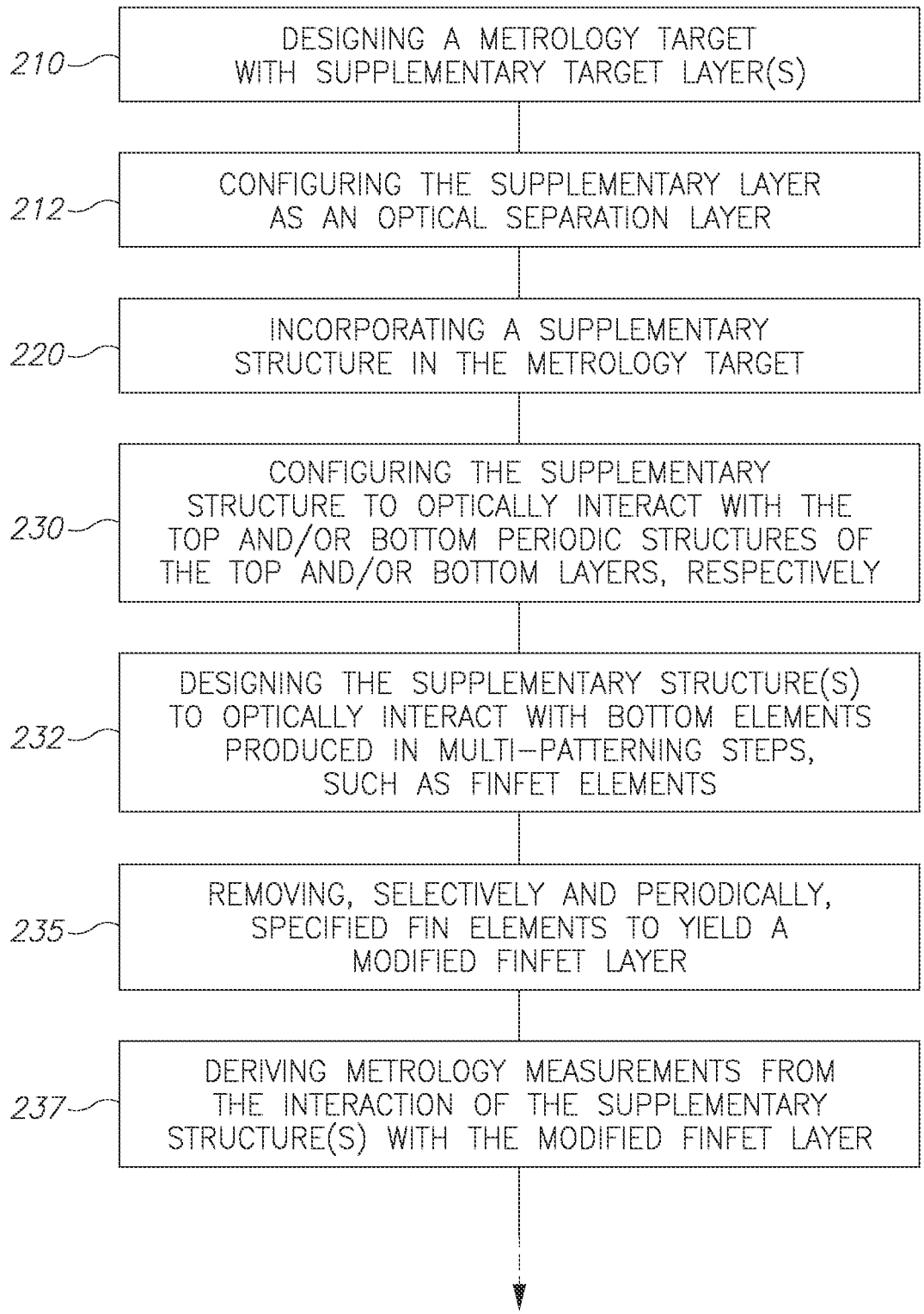
FIG. 6 is a high level schematic flowchart of a method, according to some embodiments of the invention.

FIG. 6 is a high level schematic flowchart of a method 200, according to some embodiments of the invention. Method 200 may be at least partially implemented by at least one computer processor, e.g., in a metrology module. Certain embodiments comprise computer program products comprising a computer readable storage medium having computer readable program embodied therewith and configured to carry out of the relevant stages of method 200. Certain embodiments comprise target design files of respective targets designed by embodiments of method 200. Certain embodiments comprise metrology targets produced by corresponding embodiments of method 200 and/or metrology measurements thereof.

Method 200 may comprise designing a metrology target with supplementary target structures, e.g., as one or more supplementary layer(s) (stage 210) and/or performing metrology measurements on respective metrology targets.

In certain embodiments, method 200 may comprise configuring the supplementary layer as an optical separation layer (stage 212).

Method 200 may comprise incorporating a supplementary layer having a supplementary (possibly periodic or partially periodic) structure(s) between a bottom layer and a top layer of a metrology target (stage 220), the supplementary structure configured to interact optically with at least one of a bottom periodic structure and a top periodic structure in the bottom and top layers, respectively (stage 230).

In certain embodiments, method 200 may comprise designing the supplementary structure(s) to optically interact with bottom elements, produced in multi-patterning steps such as finFET elements (stage 232). Method may comprise removing, selectively and periodically, specified finFET elements to yield a modified finFET layer (stage 235) and deriving metrology measurements from the interaction of the supplementary structure with the modified finFET layer (stage 237).

Method 200 may comprise introducing designed offsets between the top, supplementary and bottom structures (stage 240) and using paired designed offsets with opposite signs (stage 245). Method 200 may comprise designing a compound target comprising cells with different offsets between different layers (stage 250) and/or deriving metrology parameters from measurements of the cells (stage 255). Method 200 may comprise designing and/or using three layered SCOL cells and two layered imaging cells, the latter lacking the top periodic structure (stage 260). Method 200 may comprise combining two or more two-layered SCOL cells and/or two or more two-layered imaging cells, with different layer selections and different designed offsets (stage 270).

In certain embodiments, method 200 may further comprise configuring the supplementary structure to yield a detectable Moiré pattern with at least one of the top and bottom periodic structures (stage 280). Method 200 may comprise configuring the supplementary structure to yield detectable Moiré patterns with both the top and the bottom periodic structures (stage 285), e.g., two Moiré patterns within three layered cells, each layer comprising unresolved periodic structures (stage 285). The Moiré patterns may be measured with corresponding imaging cells (stage 287) and/or with corresponding SCOL cells. Method 200 may comprise designing the supplementary structure to have a pitch slightly different from a common pitch of the top and bottom structures, to yield Moiré patterns of the same pitch with either layer (stage 290), e.g., designing Moiré pattern generating cells as SCOL and/or imaging cells (stage 295).

Method 200 may further comprise producing metrology targets using a (possibly modified) device production flow (stage 300) and using device elements as part of the target. Method 200 may comprise utilizing the device production flow to introduce supplementary structure(s) to the metrology targets (stage 305). Method 200 may use process steps of the standard device manufacturing process that are usually ignored in the metrology target design, resulting in the possibility to use without modification the device production flow.

For example, method 200 may comprise producing the supplementary layer by one or more hard mask exposures (stage 307). Method 200 may comprise depositing two or more substances to generate the supplementary structure (stage 310). Method 200 may further comprise modifying parameters of supplementary structure elements using recurring etching and deposition (stage 315). In certain embodiments, the supplementary structure may be configured to yield a detectable Moiré pattern with at least one of the top and bottom periodic structures.

Method 200 may comprise deriving imaging and/or SCOL metrology measurements from the produced targets (stage 320). Method 200 may further comprise resolving phase information from Moiré pattern measurements of the target (stage 325), e.g., by interfering a SCOL first order signal from the target, by at least one of: manipulating the illumination, interfering the signal with a reference beam and interfering first with minus first order signals (stage 330) or possibly with the zeroth order signal.

In certain embodiments, method 200 comprises depositing an optical separation layer configured to block optical interaction with structures below the deposited layer, and producing a metrology target above the optical separation layer.

In the above description, an embodiment is an example or implementation of the invention. The various appearances of "one embodiment", "an embodiment", "certain embodiments" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone.

Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

Meanings of technical and scientific terms used herein are to be commonly understood as by one of ordinary skill in the art to which the invention belongs, unless otherwise defined.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A metrology target comprising:
   a top layer having a top periodic structure;
   a bottom layer having a bottom periodic structure, wherein the bottom periodic structure comprises a plurality of periodic multiply patterned elements; and
   at least one supplementary structure configured to interact optically with at least one of the bottom periodic structure or the top periodic structure such that a Moiré pattern is generated using the supplementary structure, wherein the at least one supplementary structure is fabricated of a different material than the bottom layer, and wherein the supplementary structure is positioned outside the top layer and the bottom layer such that the supplementary structure is above the top layer or below the bottom layer.

2. The metrology target of claim 1, wherein the at least one supplementary structure is configured to interact optically with the bottom periodic structure.

3. The metrology target of claim 2, wherein the multiply patterned elements comprise recurring sets of corresponding elements, and wherein the bottom periodic structure comprises multiple cells, each of the cells lacking one of the multiply patterned elements in the recurring set.

4. The metrology target of claim 1, wherein the bottom and top periodic structures have a same pitch and wherein the at least one supplementary structure has a pitch that is different from the same pitch to an extent that generates a detectable Moiré pattern between the periodic structures.

5. The metrology target of claim 1, comprising an array of imaging cells, each cell having different combinations of designed offsets between the at least one supplementary structure and the top and bottom periodic structures.

6. The metrology target of claim 1, wherein each of the periodic multiply patterned elements has a width that is narrower than a width of the supplementary structure.

7. The metrology target of claim 1, wherein the bottom periodic structure is made of finFET elements.

8. The metrology target of claim 1, wherein the supplementary structure is above the top layer.

9. The metrology target of claim 1, wherein the supplementary structure is below the bottom layer.

10. A method comprising:
   providing a metrology target including:
      a top layer having a top periodic structure;
      a bottom layer having a bottom periodic structure, wherein the bottom periodic structure comprises a plurality of periodic multiply patterned elements; and
      at least one supplementary structure configured to interact optically with at least one of the bottom periodic structure or the top periodic structure such that a Moiré pattern is generated using the supplementary structure, wherein the at least one supplementary structure is fabricated of a different material than the bottom layer, and wherein the supplementary structure is positioned outside the top layer and the bottom layer such that the supplementary structure is above the top layer or below the bottom layer; and
   performing metrology measurements on the metrology target.

11. The method of claim 10, wherein the supplementary structure interacts optically with multiply patterned elements in the bottom periodic structure.

12. The method of claim 11, further comprising removing, selectively and periodically, some of the multiply patterned elements to yield a modified multiply patterned layer and deriving metrology measurements from the interaction of the at least one supplementary structure with the modified multiply patterned layer.

13. The method of claim 10, further comprising configuring the at least one supplementary structure to yield a detectable Moiré pattern with at least one of the top periodic structure or bottom periodic structure.

14. The method of claim 13, further comprising configuring the at least one supplementary structure to yield detectable Moiré patterns with both the top and the bottom periodic structures.

15. The method of claim 10, further comprising producing the at least one supplementary structure within a device production process by one or more hard mask exposures.

16. The method of claim 10, further comprising depositing two or more substances to generate the at least one supplementary structure.

17. The method of claim 16, further comprising modifying parameters of supplementary structure elements using recurring etching and deposition.

18. The method of claim 17, wherein the at least one supplementary structure is configured to yield a detectable Moiré pattern with at least one of the top periodic structure or bottom periodic structure, the method further comprising resolving phase information from Moiré pattern measurements of the target.

19. The method of claim 10, wherein the supplementary structure is above the top layer.

20. The method of claim 10, wherein the supplementary structure is below the bottom layer.

* * * * *